United States Patent
Liang et al.

(10) Patent No.: US 9,941,658 B2
(45) Date of Patent: Apr. 10, 2018

(54) STACKABLE ELECTRICALLY-ISOLATED DIODE-LASER BAR ASSEMBLY

(71) Applicant: Coherent, Inc., Santa Clara, CA (US)

(72) Inventors: Xiaoping Liang, Fremont, CA (US); Fei Zhou, Fremont, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 15/498,253

(22) Filed: Apr. 26, 2017

(65) Prior Publication Data
US 2017/0346255 A1 Nov. 30, 2017

Related U.S. Application Data

(60) Provisional application No. 62/340,999, filed on May 24, 2016.

(51) Int. Cl.
| | |
|---|---|
| *H01L 23/44* | (2006.01) |
| *H01S 5/024* | (2006.01) |
| *H01S 5/40* | (2006.01) |
| *H01S 5/022* | (2006.01) |

(52) U.S. Cl.
CPC ........ *H01S 5/02423* (2013.01); *H01S 5/0224* (2013.01); *H01S 5/02272* (2013.01); *H01S 5/02276* (2013.01); *H01S 5/4025* (2013.01)

(58) Field of Classification Search
CPC . H01S 5/02272; H01S 5/02276; H01S 5/4025
USPC .............................. 372/34, 35, 36
See application file for complete search history.

(56) References Cited

U.S. PATENT DOCUMENTS

| | | | |
|---|---|---|---|
| 4,716,568 A | * | 12/1987 | Scifres ............... H01S 5/02236 372/36 |
| 5,105,429 A | | 4/1992 | Mundinger et al. |
| 5,105,430 A | | 4/1992 | Mundinger et al. |
| 5,305,344 A | | 4/1994 | Patel et al. |
| 6,027,256 A | * | 2/2000 | Nightingale ........ H01S 5/02208 385/88 |
| 7,365,986 B2 | | 4/2008 | Yoshioka et al. |
| 7,656,915 B2 | | 2/2010 | Coleman et al. |
| 7,957,439 B2 | | 6/2011 | Stephens et al. |
| 8,130,807 B2 | | 3/2012 | Schulz-Harder et al. |
| 8,254,422 B2 | | 8/2012 | Datta et al. |
| 8,787,414 B1 | | 7/2014 | Chin et al. |

(Continued)

OTHER PUBLICATIONS

Apollonov V Vet al: "Investigation of the Thermal Properties of a Linear Array of Laser Diodes on a Silicon Carbide Heat Sink", Quantum Electronics, Turpion Ltd., London, GB, vol. 27, No. 10, Oct. 1, 1997 (Oct. 1, 1997), pp. 845-849, XP000724789, ISSN: 1063-7818, DOI: 10.1070/QE 1997V027N 10ABEH001076.*

(Continued)

*Primary Examiner* — Tuan Nguyen
(74) *Attorney, Agent, or Firm* — Morrison & Foerster LLP

(57) ABSTRACT

A diode-laser bar assembly comprises a diode-laser bar mounted onto a cooler by way of an electrically-insulating submount. A laminated connector is provided that includes two electrically-conducting sheets bonded to opposite sides on an electrically-insulating sheet. An electrical insulator is located between the laminated connector and the cooler. One electrically-conducting sheet is connected to n-side of the diode-laser bar and the other electrically-conducting sheet is connected to p-side of the diode-laser bar.

20 Claims, 5 Drawing Sheets

(56) References Cited

U.S. PATENT DOCUMENTS 9,065,238 B2 6/2015 Schleuning et al.
2006/0262819 A1 11/2006 Treusch et al.

OTHER PUBLICATIONS

International Search Report and Written Opinion recieved for PCT Patent Application No. PCT/US2017/029932, dated Oct. 25, 2017, 13 pages.
Apollonov et al., "Investigation of the Thermal Properties of a Laser-Diode Linear Array on a Silicon Carbide Heat Sink", Quantum Electronics, vol. 27. No. 10, pp. 845-848.
Feeler et al., "High Density Pulsed Laser Diode Arrays for SSL Pumping", Northrop Grumman Cutting Edge Optronics, Application Note 15, Proceedings of SPIE, vol. 7686, Apr. 2010, 10 pages.

\* cited by examiner

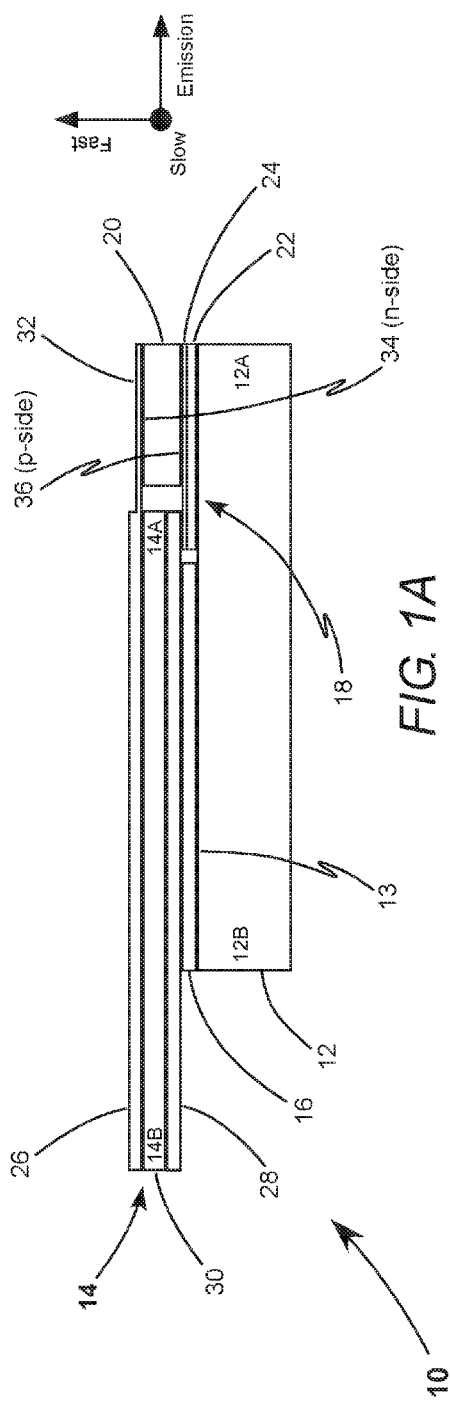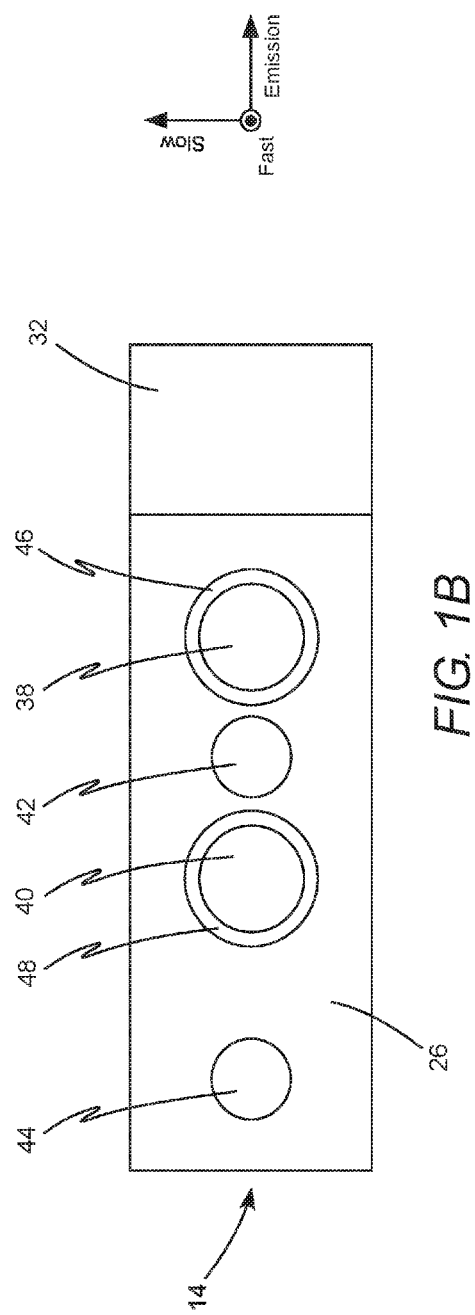
FIG. 1A
FIG. 1B

US 9,941,658 B2

STACKABLE ELECTRICALLY-ISOLATED DIODE-LASER BAR ASSEMBLY

PRIORITY

This application claims priority to U.S. Provisional Patent Application No. 62/340,999, filed May 24, 2016, the entire disclosure of which is incorporated herein by reference.

TECHNICAL FIELD OF THE INVENTION

The present invention relates in general to diode-laser bar packaging. The invention relates in particular to packaging diode-laser bars on a water-cooled heat-sink.

DISCUSSION OF BACKGROUND ART

Diode-lasers are efficient devices for converting electrical power into coherent optical power. In this respect, they represent the most efficient class of laser devices. An edge-emitting diode-laser has a waveguide resonator that is typically hundreds of micrometers (μm) long and emits laser-radiation from an end facet. The laser-radiation from a diode-laser emitter is characterized as strongly divergent in a fast-axis direction and weakly divergent in a slow-axis direction. The fast-axis, slow-axis, and emission directions are mutually orthogonal.

For high-power applications, diode-laser bars having a plurality of diode-laser emitters in a "horizontal" linear array thereof provide a convenient way to scale optical power available from a single diode-laser emitter. For further power scaling, a plurality of diode-laser bars can be stacked together "vertically" to make a two-dimensional array of diode-laser emitters. Diode-laser bars arranged in this manner are typically referred to as a "vertical stack" or "fast-axis stack". Diode-laser bars are preferably stacked with minimum bar-to-bar pitch, to maximize brightness of the laser-radiation emitted from the stack.

The term "packaging" applied to diode-laser bars refers to mounting a diode-laser bar on some sort of cooling-base or heat-sink. This base may be a relatively massive base providing a "conductively cooled package" (CCP). For higher power operation, the base is typically cooled by a liquid coolant that flows through a micro-channel arrangement. Micro-channels horizontally confine coolant flow within a cooler and typically have internal dimensions of less than 1 millimeter (mm). The coolant is usually water, or water with various additives.

A diode-laser bar includes a plurality of semiconductor layers epitaxially grown on a single-crystal substrate, with the plurality of diode-laser emitters defined in the epitaxial layers. Typically, the substrate is an n-type substrate, and layers are grown such that layers forming the "p-side" (anode-side) of the diodes are uppermost. The diode-laser bar is soldered "p-side down", either directly onto the heat-sink or via a submount having a coefficient of thermal expansion (CTE) intermediate that of the substrate material and the heat-sink material, which is usually copper.

Electrical connection to the diode-laser bars places the heat-sink and cooling-water therein, in electrical contract with the diode-laser bar energizing circuit. The cooling water can short-circuit electric connection to the bars, unless the electrical conductivity of the water is low. A common solution to this is to use de-ionized (DI) or high-resistance water. However, DI water is more corrosive on metals than utility water from conventional building supplies, and the use of DI water is expensive and inconvenient by comparison.

Even small "stray" currents through the cooling water, between metal elements at different electric potentials, can cause metal corrosion through galvanic action. In addition to erosion of metal elements, particles produced by galvanic action can block cooling-channels in micro-channel cooled arrangements.

There is a need for an improved diode-laser bar assembly, having the cooling water electrically isolated from both the n-side and p-side electrical potentials. Preferably, DI water should not be required as the coolant. The diode-laser bar assembly should preferably be thin and stackable with a small bar-to-bar pitch.

SUMMARY OF THE INVENTION

In one aspect, a diode-laser bar apparatus in accordance with the present invention comprises a cooler having first and second opposite ends, and an electrical insulator bonded to a top surface of the cooler at the first end thereof. A submount is provided having an electrically-conducting layer overlying an electrically-insulating layer. The electrically-insulating layer is bonded to the top surface of the cooler at the second end thereof. A diode-laser bar is provided having first and second opposite sides. The first side is bonded to the electrically-conducting layer of the submount and is in electrical contact therewith. A laminated connector is provided having first and second electrically-conducting sheets overlaying opposite surfaces of an electrically-insulating sheet. The first electrically-conducting sheet is in electrical contact with the second side of the diode-laser bar. The second electrically-conducting sheet is bonded to the electrically-conducting layer of the submount, in electrical contact therewith and electrically isolated from the top surface of the cooler. The second electrically-conducting sheet is also bonded to the electrical-insulator. The laminated connector extends beyond the cooler, exposing the first and second electrically-conducting sheets.

In another aspect, a stack of diode-laser bar assemblies in accordance with the present invention, each one comprising a cooler having first and second opposite ends, a first electrical insulator bonded to a top surface of the cooler at the first end thereof, and a second electrical insulator bonded to a bottom surface of the cooler. A submount is provided having an electrically-conducting layer overlying an electrically-insulating layer. The electrically-insulating layer is bonded to the top surface of the cooler at the second end thereof. A diode-laser bar is provided having first and second opposite sides. The first side is bonded to the electrically-conducting layer of the submount and is in electrical contact therewith. A laminated connector is provided having first and second electrically-conducting sheets overlaying opposite surfaces of an electrically-insulating sheet. The first electrically-conducting sheet is in electrical contact with the second side of the diode-laser bar. The second electrically-conducting sheet is bonded to the electrically-conducting layer of the submount, in electrical contact therewith and electrically isolated from the top surface of the cooler. The second electrically-conducting sheet is also bonded to the first electrical-insulator. The laminated connector extends beyond the cooler, exposing the first and second electrically-conducting sheets. The second electrical insulator of a first diode-laser bar assembly is mounted onto the laminated connector of a second diode-laser bar assembly.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A is a side-elevation view schematically illustrating one preferred embodiment of a diode-laser bar assembly in accordance with the present invention, comprising a cooler having a diode-laser bar mounted thereon, and a laminated connector for making electrical connections to the diode-laser bar.

FIG. 1B is a plan view from above schematically illustrating details of the diode-laser bar assembly of FIG. 1A.

DETAILED DESCRIPTION OF THE INVENTION

Figure 2:
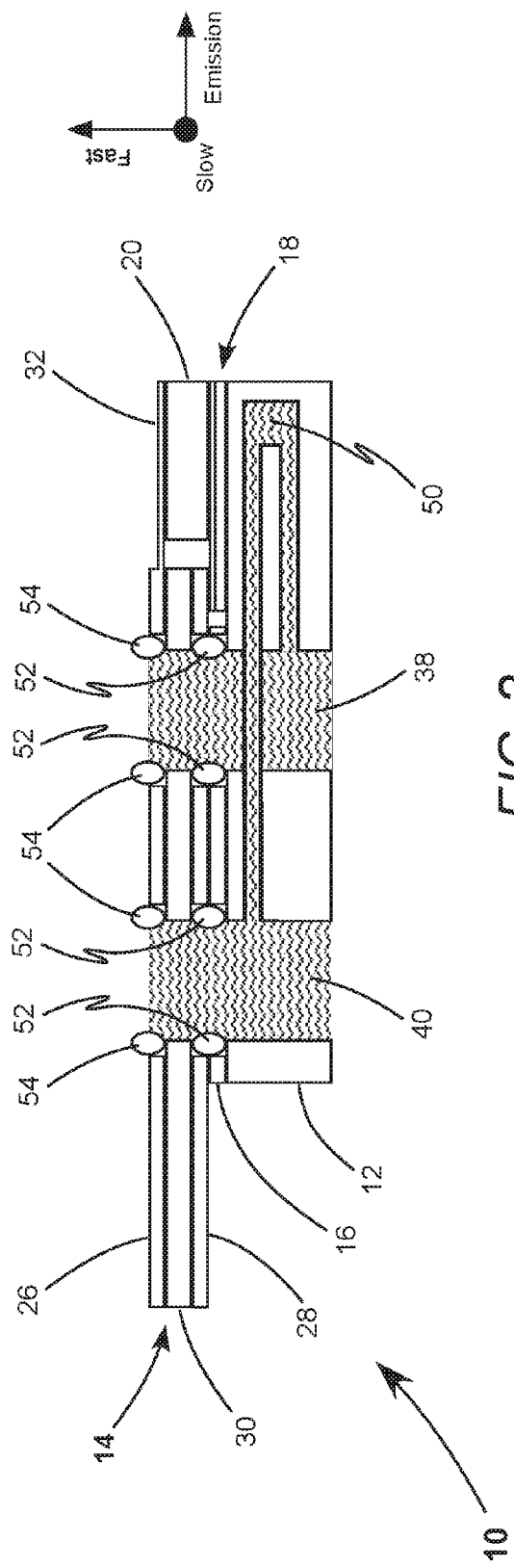
FIG. 2 is a side-elevation view, partially in cross-section, schematically illustrating cooling water within the diode-laser bar assembly of FIGS. 1A and 1B.

Turning now to the drawings, wherein like features are designated by like reference numerals, FIG. 1A is a side-elevation view schematically illustrating one preferred embodiment 10 of a diode-laser bar assembly in accordance with the present invention. Assembly 10 includes a cooler 12, a laminated connector 14, an electrical insulator 16, a submount 18, and a diode-laser bar 20. Diode-laser bar 20 has characteristic fast, slow, and emission axes as indicated in the drawing.

Submount 18 includes an insulating layer 22 overlaid by a conducting layer 24. Conducting layer 24 is preferably made of a metal that is highly thermally-conducting and highly electrically-conducting, most preferably copper (Cu). Conducting layer 24 may be a discrete metal layer bonded to insulating layer 22 or a metal coating applied to insulating layer 22.

Insulating layer 22 is preferably made of an electrically-insulating material having a coefficient of thermal expansion (CTE) matched to the CTE of diode-laser bar 20. Here, "matched" means the effective CTE of submount 18 is close to the CTE of the diode-laser bar material. By way of example, for a diode-laser bar including GaAs and a conducting layer made of copper, insulating layer 22 is most preferably made of beryllium oxide (BeO) or aluminum nitride (AlN). Electrical insulator 16 is preferably made of aluminum oxide ($Al_2O_3$) or a polymer.

Insulating layer 22 of submount 18 is bonded onto a top surface 13 of cooler 12 at a proximal end 12A thereof. Electrical insulator 16 is bonded onto top surface 13 of cooler 12 at a distal end 12B thereof. Terms such as "top" and "bottom" are used here for convenience of description, and are not meant to imply specific spatial orientations of the diode-laser bar assembly in use.

Laminated connector 14 comprises a conducting sheet 26 and a conducting sheet 28 bonded to opposite sides of an insulating sheet 30. Conducting sheets 26 and 28 are preferably made from a metal that is electrically conducting, most preferably copper. Insulating sheet 30 is made of a material that is electrically-insulating and preferably a material that is mechanically compliant, most preferably a polymer. Conducting sheets 26 and 28 overlay both sides of insulating sheet 30. Conducting sheet 26 extends beyond insulating sheet 30 at a proximal end 14A of laminated connector 14, thereby forming an n-side contact 32. Sheets 26, 28, and 30 of laminated connector 14 are preferably bonded together using an adhesive, for example an epoxy adhesive.

An n-side 34 of diode-laser bar 20 is bonded to n-side contact 32 of laminated connector 14. N-side 34 of diode-laser bar 20 is thereby in electrical contact with conducting sheet 26. A p-side 36 of diode-laser bar 20 is bonded to conducting layer 24 of submount 18. The diode-laser bar is thereby sandwiched between the laminated connector and the submount bonded onto proximal end 12A of the cooler. Conducting sheet 28 of laminated connector 14 is bonded to conducting layer 24 of submount 18, and to electrical insulator 16. P-side 36 of diode-laser bar 20 is thereby in electrical contact with conducting sheet 28 via conducting layer 24. Waste heat from diode-laser bar 20 is conducted away through submount 18 and removed by cooling water flowing through cooler 12.

A distal end 14B of laminated connector 14 extends beyond distal end 12B of cooler 12, thereby exposing conducting sheets 26 and 28 for electrical connection of diode-laser bar 20 to an external electrical driver (not shown). Laminated connector 14 may extend beyond any side-face of cooler 12 to facilitate electrical connection, without departing from the spirit and scope of the present invention, provided the laminated connector does not impede emission from the diode-laser bar.

FIG. 1B is a plan view schematically illustrating further details of diode-laser bar assembly 10. Assembly 10 further includes a coolant inlet port 38, a coolant outlet port 40, and optional bolt-holes 42 and 44. Coolant ports 38 and 40 are discussed in detail herein below. Laminated connector 14 has o-ring seats 46 and 48 for making fluid-tight seals to coolant ports 38 and 40, respectively. Optional bolt-holes 42 and 44 through diode-laser bar assembly 10 facilitate mounting the diode-laser bar assembly, and enable a plurality of such diode-laser bar assemblies to be vertically stacked for power scaling.

FIG. 2 is a side-elevation view, partly in cross-section, schematically illustrating cooling water (wavy patterned hatch) within diode-laser bar assembly 10. Cooling water flows from an external supply (not shown) through coolant inlet port 38 and into coolant micro-channels 50 within cooler 12, under pressure from the external supply. Coolant micro-channels 50 are located below and close to diode-laser bar 20 for efficient heat removal. Cooling water flows from coolant micro-channels 50 into coolant outlet port 40.

O-rings 52 are located within the diode-laser bar assembly 10 in order to make fluid-tight seals and thereby provide electrical isolation between the cooling water and conducting sheet 28. Similarly, o-rings 54 make fluid-tight seals, and thereby provide electrical isolation between the cooling water and conducting sheet 26. There is electrical-isolation between the cooling water and electric potentials of the external electrical driver, even if the outside surfaces of cooler 12 are not electrically isolated from the cooling water. Those skilled in the art would recognize that fluid-tight seals may be made by means other than o-rings, without departing from the spirit and scope of the present invention.

Figure 3:
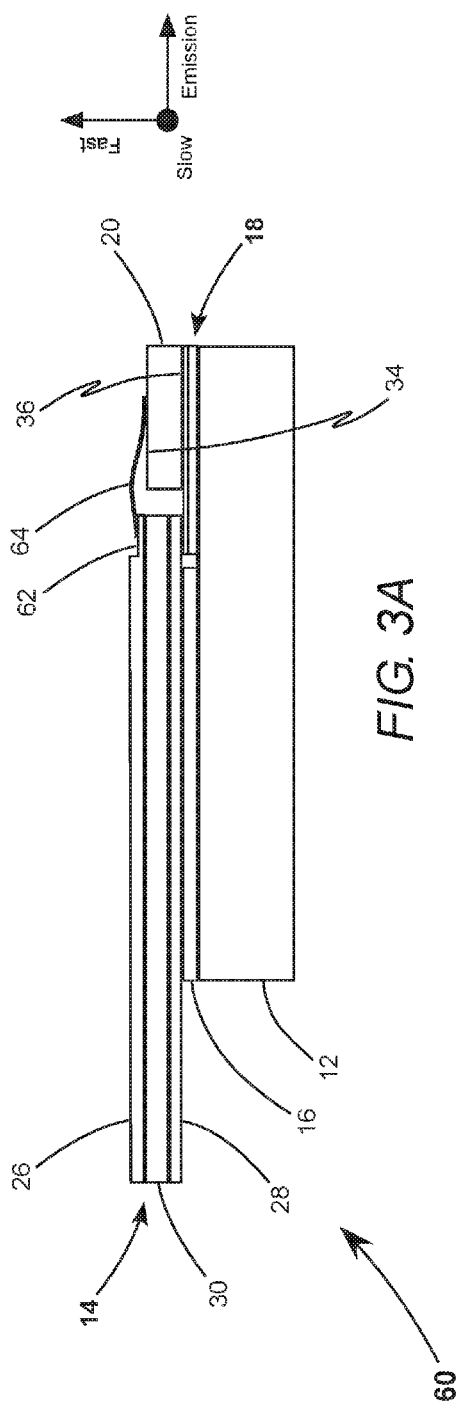
FIG. 3A is a side-elevation view schematically illustrating another preferred embodiment of a diode-laser bar assembly in accordance with the present invention, similar to the embodiment of FIG. 1A, but further including wire-bond connectors between the laminated connector and the diode-laser bar.
FIG. 3B is a plan view from above schematically illustrating details of the wire-bond connectors in the diode-laser bar assembly of FIG. 3A.

FIG. 3A and FIG. 3B are respectively a side-elevation view and a plan view schematically illustrating another preferred embodiment 60 of a diode-laser bar assembly in accordance with the present invention. Assembly 60 is similar to assembly 10 of FIG. 1A, with an exception that an n-side contact 62 is notched into conducting sheet 26, instead of extending from conducting sheet 26 in the manner of n-side contact 32 in assembly 10. A plurality of flexible connectors 64 (only one thereof visible in FIG. 3A) electrically connect n-side contact 62 of conducting sheet 26 and n-side 34 of diode-laser bar 20. Flexible connectors 64 are preferably made using wire-bond technology.

Regarding exemplary dimensions of diode-laser bar assembly 60 made of the above-referenced preferable materials, for a 0.14 millimeter (mm) thick diode-laser bar and a 1.30 mm thick cooler, electrical insulator 16 and submount 18 each have a preferred thickness between about 0.30 mm and 1.20 mm, most preferably about 0.63 mm. Conducting sheet 26 of laminated connector 14 has a preferred thickness of about 0.20 mm. Conducting sheet 28 and insulating sheet 30 of laminated connector 14 each have a preferred thickness of about 0.13 mm.

Figure 4:
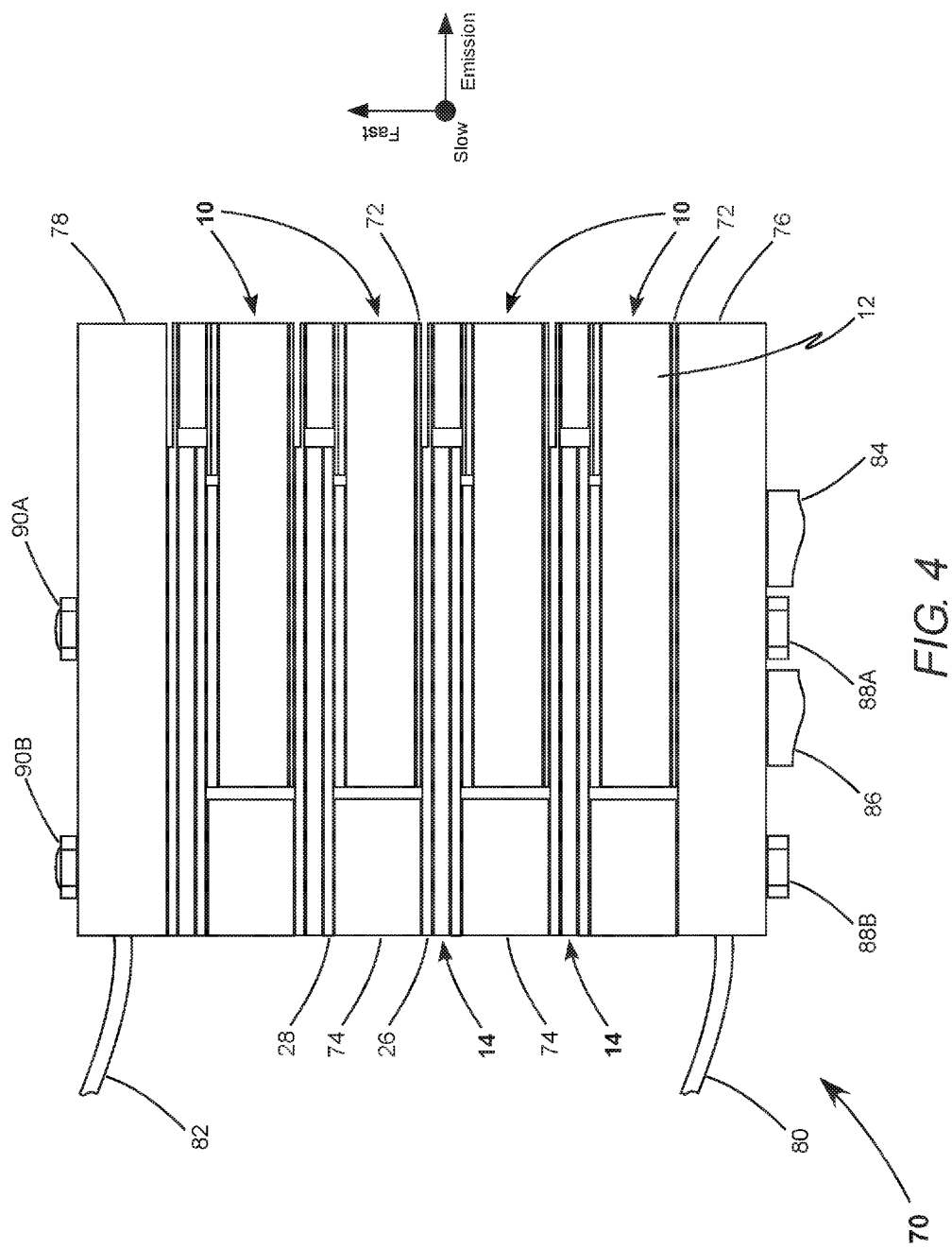
FIG. 4 is a side-elevation view schematically illustrating one preferred embodiment of a diode-laser bar stack in accordance with the present invention, comprising a plurality of diode-laser bar assemblies of FIGS. 1A and 1B stacked one above another.

FIG. 4 is a side elevation view schematically illustrating one preferred embodiment 70 of a diode-laser bar stack in accordance with the present invention. In stack 70, four diode-laser bar assemblies 10 are stacked together vertically, as described above. More or less assemblies can be stacked without departing from the spirit and scope of the present invention. Diode-laser bar assemblies 60 are similarly stackable.

Stack 70 includes a plurality of electrical insulators 72, one thereof bonded to a bottom surface of cooler 12 of each diode-laser bar assembly 10. Electrical insulator 72 provides electrical isolation between the cooling water and laminated connector 14, but may be omitted if the bottom surface of cooler 12 is made of an electrical insulator. Electrical insulator 72 is preferably made of $Al_2O_3$ or a polymer.

Stack 70 includes a plurality of electrically-conducting spacers 74. Each spacer is sandwiched between laminated connectors 14 of adjacent diode-laser bar assemblies 10. Spacer 74 electrically connects conducting sheet 26 and conducting sheet 28 of adjacent diode-laser bar assemblies 10. This arrangement has the diode-laser bar assemblies electrically connected in series, which enables the whole stack to be electrically driven from one external current source (not shown).

Vertically stacking diode-laser bar assemblies 10 enables the whole stack to be cooled in parallel by a single external supply of cooling water (not shown). An o-ring 54 (shown in FIG. 2) is installed in each o-ring seat 46 and 48 (shown in FIG. 1B and FIG. 3B), as discussed above. Coolant inlet ports 38 collectively form an internal channel delivering cooling water to each diode-laser bar assembly. Coolant outlet ports 40 collectively form another internal channel collecting cooling water after passage through each diode-laser bar assembly.

An end block 76 and another end block 78 bracket each end of stack 70 to facilitate electrical and coolant connections. An anode wire 80 connects to block 76 and a cathode wire 82 connects to block 78. An external coolant inlet port 84 connects to the internal channel delivering cooling water and an external outlet port 86 connects to the internal channel collecting cooling water. External coolant ports 84 and 86 are thereby in fluid connection with coolant ports 38 and 40, respectively, of every diode-laser bar assembly. Cooling water flows under pressure of the external supply through external coolant inlet port 84, in parallel through all the diode-laser bar assemblies, and returns through external coolant outlet port 86. Not all these features are depicted in for simplicity of illustration.

FIG. 4 depicts stack 70 held together mechanically by bolts 88A and 88B, which are secured respectively by nuts 90A and 90B. Those skilled in the art of electro-optical design would recognize that this hardware (including blocks 76 and 78) can be customized or replaced with functionally equivalent elements, as necessary, without departing from the spirit and scope of the present invention.

Figure 5:
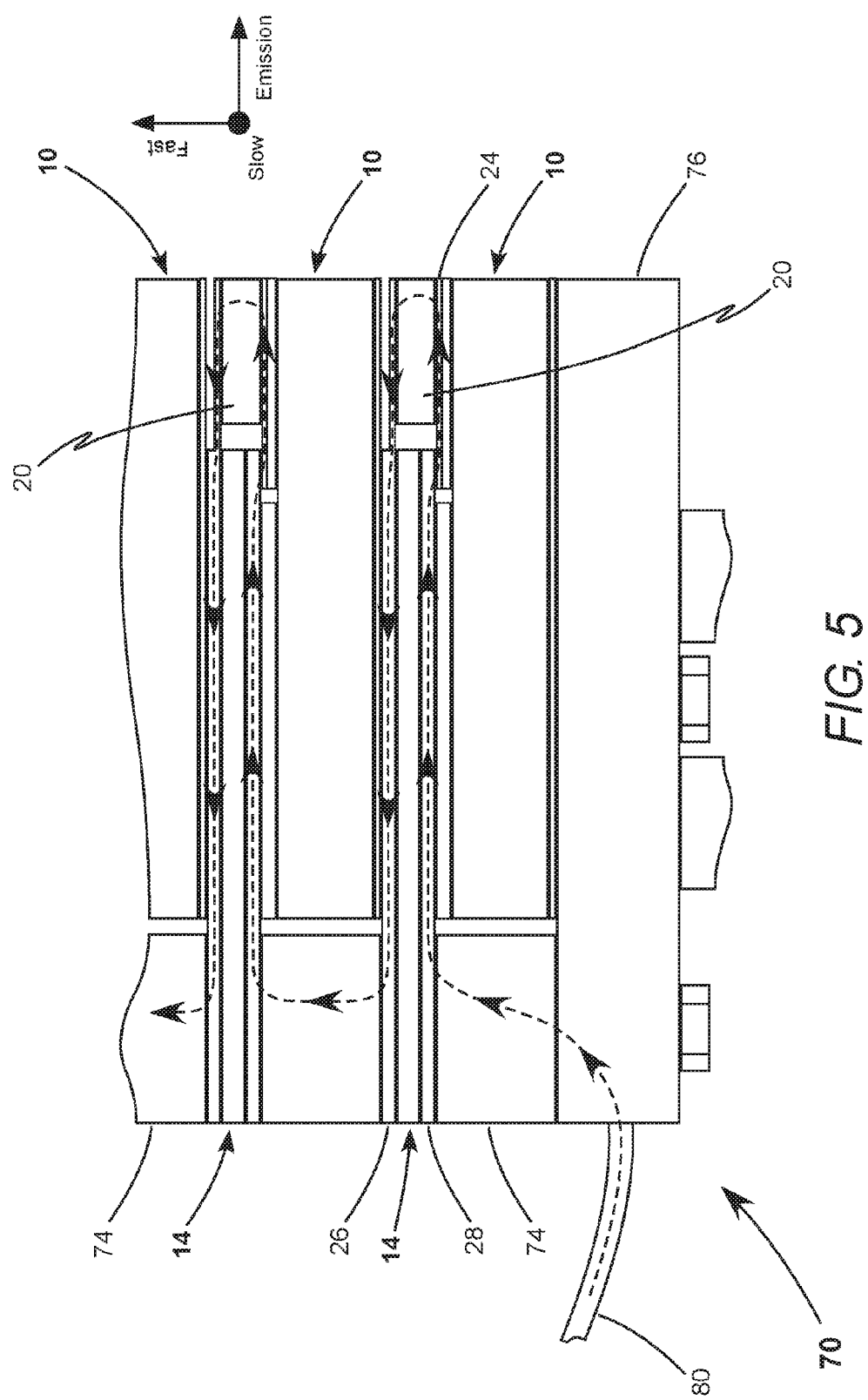
FIG. 5 is a side-elevation view, partially in cross-section, schematically illustrating electrical current flow through the diode-laser bar stack of FIG. 4.

FIG. 5 is a side elevation view, partially in cross-section, schematically illustrating conventional current flow (dashed arrowed line) through stack 70. For each diode-laser bar assembly 10, laminated connector 14 electrically connects diode-laser bar 20 to adjacent spacers 74. Conducting sheet 26 makes this connection on the n-side of the diode-laser bar. Conducting layer 24 and conducting sheet 28 together make this connection on the p-side. Current originates from the current source. Current then flows though anode wire 80, through block 76, and alternately through each spacer 74 and each diode-laser bar assembly 10. Current returns through block 78 and cathode wire 82 back to the current source, thereby completing an electrical circuit. Not all these features are depicted for simplicity of illustration.

Alternatively, the stacked diode-laser bar assemblies may be supplied with current individually, by either omitting or substituting the electrically-conducting spacers and connecting one or more external current sources directly to each laminated connector. Of course, this may be inconvenient or not cost effective, compared with the above described method.

The present invention is described above in terms of a preferred embodiment and other embodiments. The invention is not limited, however, to the embodiments described and depicted herein. Rather, the invention is limited only by the claims appended hereto.

What is claimed is:

1. Diode-laser bar apparatus, comprising:
  a cooler having first and second opposite ends;
  an electrical insulator bonded to a top surface of the cooler, at the first end thereof;
  a submount having an electrically-conducting layer overlying an electrically-insulating layer, the electrically-insulating layer bonded to the top surface of the cooler, at the second end thereof;
  a diode-laser bar having first and second opposite sides, the first side bonded to the electrically-conducting layer of the submount, in electrical contact therewith;
  a laminated connector having first and second electrically-conducting sheets overlaying opposite surfaces of an electrically-insulating sheet, the first electrically-conducting sheet in electrical contact with the second side of the diode-laser bar, the second electrically-conducting sheet bonded to the electrically-conducting layer of the submount, in electrical contact therewith and electrically isolated from the top surface of the cooler, the second electrically-conducting sheet also bonded to the electrical-insulator; and wherein the laminated connector extends beyond the cooler, exposing the first and second electrically-conducting sheets.

2. The apparatus of claim 1, wherein the first electrically-conducting sheet of the laminated connector extends beyond the electrically-insulating sheet, and directly contacts the second side of the diode-laser bar.

3. The apparatus of claim 1, wherein the first electrically-conducting sheet is electrically connected to the second side of the diode-laser bar by a wire-bond connector.

4. The apparatus of claim 1, wherein the first side of the diode-laser bar is a p-side and the second side of the diode-laser bar is an n-side.

5. The apparatus of claim 1, wherein the electrically-conducting layer of the submount is made of copper.

6. The apparatus of claim 1, wherein the electrically-insulating layer of the submount is made of beryllium oxide.

7. The apparatus of claim 1, wherein the electrically-insulating layer of the submount is made of aluminum nitride.

8. The apparatus of claim 1, wherein the electrical insulator is made of a polymer.

9. The apparatus of claim 1, wherein the electrical insulator is made of aluminum oxide.

10. The apparatus of claim 1, wherein the first and second electrically-conducting sheets of the laminated connector are made of copper.

11. The apparatus of claim 1, wherein the electrically-insulating sheet of the laminated connector is made of a mechanically compliant material.

12. The apparatus of claim 11, wherein the electrically-insulating sheet of the laminated connector is made of a polymer.

13. Diode laser bar apparatus, comprising:
a stack of diode-laser bar assemblies, each assembly in the stack including:
a cooler having first and second opposite ends;
a first electrical insulator bonded to a top surface of the cooler, at the first end thereof;
a second electrical insulator bonded to a bottom surface of the cooler;
a submount having an electrically-conducting layer overlying an electrically-insulating layer, the electrically-insulating layer bonded to the top surface of the cooler, at the second end thereof;
a diode-laser bar having first and second opposite sides, the first side bonded to the electrically-conducting layer of the submount, in electrical contact therewith;
a laminated connector having first and second electrically-conducting sheets overlaying opposite surfaces of an electrically-insulating sheet, the first electrically-conducting sheet in electrical contact with the second side of the diode-laser bar, the second electrically-conducting sheet bonded to the electrically-conducting layer of the submount, in electrical contact therewith and electrically isolated from the top surface of the cooler, the second electrically-conducting sheet also bonded to the first electrical-insulator;
wherein the laminated connector extends beyond the cooler, exposing the first and second electrically-conducting sheets; and
wherein the second electrical insulator of a first diode-laser bar assembly is mounted onto the laminated connector of a second diode-laser bar assembly.

14. The stack of claim 13, wherein the first electrically-conducting sheet of each diode-laser bar assembly extends beyond the electrically-insulating sheet, and directly contacts the second side of the diode-laser bar.

15. The stack of claim 13, wherein the first electrically-conducting sheet of each diode-laser bar assembly is electrically connected to the second side of the diode-laser bar by a wire-bond connector.

16. The stack of claim 13, wherein the first side of each diode-laser bar is a p-side and the second side of each diode-laser bar is an n-side.

17. The stack of claim 13, wherein each second electrical insulator is made of a polymer.

18. The stack of claim 13, wherein each second electrical insulator is made of aluminum oxide.

19. The stack of claim 13, wherein an electrically-conducting spacer is sandwiched between and electrically connects the second electrically-conducting sheet of the first diode-laser bar assembly and the first electrically-conducting sheet of the second diode-laser bar assembly.

20. The stack of claim 13, wherein an electrically-conducting spacer is sandwiched between the laminated connectors of each pair of adjacent diode-laser bar assemblies, electrical current flowing alternately through each electrically-conducing spacer and each diode-laser bar assembly.

* * * * *